US007126072B2

(12) United States Patent
Saitoh

(10) Patent No.: US 7,126,072 B2
(45) Date of Patent: Oct. 24, 2006

(54) KEY SWITCH AND ELECTRONIC DEVICE

(75) Inventor: Masashi Saitoh, Utsunomiya (JP)

(73) Assignee: Polymatech Co., ltd., Tokyo (JP)

( * ) Notice: Subject to any disclaimer, the term of this patent is extended or adjusted under 35 U.S.C. 154(b) by 0 days.

(21) Appl. No.: 11/212,147

(22) Filed: Aug. 26, 2005

(65) Prior Publication Data
US 2006/0042921 A1    Mar. 2, 2006

(30) Foreign Application Priority Data
Aug. 31, 2004 (JP) ............... 2004-252736

(51) Int. Cl.
H01H 1/10 (2006.01)
(52) U.S. Cl. .............. 200/512; 200/314; 335/205
(58) Field of Classification Search ............ 200/5 A, 200/18, 512, 562, 310–311, 314–316, 329; 335/205–207
See application file for complete search history.

(56) References Cited
U.S. PATENT DOCUMENTS 4,054,860 A    10/1977    Henderson et al. ....... 338/32 H
4,414,452 A *  11/1983    Denley ..................... 200/512
5,280,145 A *   1/1994    Mosier et al. ............. 200/313
5,664,667 A *   9/1997    Kenmochi ................. 200/314
5,747,756 A *   5/1998    Boedecker ................ 200/5 A
6,188,332 B1    2/2001    Scarlata ..................... 341/35
6,259,046 B1 *  7/2001    Iwama et al. ............. 200/5 A
6,294,906 B1    9/2001    Kuechler .................. 323/371
6,417,467 B1 *  7/2002    Yamagata ................. 200/5 A

FOREIGN PATENT DOCUMENTS

EP    0 570 870 A2    11/1993
EP    1 189 035 A2     3/2002
JP    2004-220369      8/2004

* cited by examiner

Primary Examiner—K. Lee
(74) Attorney, Agent, or Firm—Fish & Richardson P.C.

(57) ABSTRACT

A jog dial switch, which functions as a key switch, includes a key sheet, a rotatable key top arranged on the key sheet, and a movement amount detector for detecting movement amount of the key top. The movement amount detector includes four permanent magnets arranged on the key top, three Hall elements, and an electric circuit for processing signals output from the Hall elements. The Hall elements and the electric circuit are arranged below the key sheet. The key sheet is formed by a water resistant material and covers the electric circuit.

18 Claims, 3 Drawing Sheets

KEY SWITCH AND ELECTRONIC DEVICE

BACKGROUND OF THE INVENTION

The present invention relates to a key switch for performing an input operation in electronic devices, such as a remote controller, various types of key boards, a cellular phone, a personal digital assistant (PDA), and a digital still camera (DSC).

In the prior art, Japanese Laid-Open Patent Publication No. 2004-220369 describes an example of a key switch used to perform an input operation for an electronic device. The key switch includes a key sheet arranged in a frame for a cellular phone or the like, a movable key top arranged on the key sheet, and a movement amount detector for detecting the movement amount of the key top. The key top is arranged in an opening of the frame. The movement amount detector includes a plurality of magnets, which are arranged on the key top, and a magnetic detection member. The magnetic detection member is arranged on the key sheet and formed by an electric circuit including a magnetic detection sensor, a signal processor such as a central processor (CPU), and wires connecting these devices.

However, water, such as rainwater, and dust may enter the frame from between the opening and the key top. Such water or dust that enters the frame may easily come into contact with the electric circuit on the key sheet. This may short-circuit the electric circuit. Accordingly, the key switch has a shortcoming in that it has low water resistance and low dust resistance.

SUMMARY OF THE INVENTION

It is an object of the present invention to provide a key switch and electronic device that increases the water resistance and dust resistance of a movement amount detector.

One aspect of the present invention is a key switch including a key sheet arranged in a frame. A key top is movably arranged on the key sheet. A movement amount detector detects movement amount of the key top. The movement amount detector includes a magnet arranged on the key top. A magnetic detection sensor is arranged in or below the key sheet. An electric circuit arranged below the key sheet processes a signal output from the magnetic detection sensor. The electric circuit is covered by the key sheet. The key sheet is formed from a material that is water resistant and transmits magnetism.

A further aspect of the key switch is a key sheet arranged in a frame. A key top is movably arranged on the key sheet. A movement amount detector detects movement amount of the key top. The movement amount detector includes a reflective member arranged on the key top, a light source, and a light detection sensor arranged in or below the key sheet. An electric circuit is arranged below the key sheet to process a signal output from the light detection sensor. The electric circuit is covered by the key sheet. The key sheet is formed from a material that is water resistant and transmits magnetism.

Another aspect of the present invention is an electronic device including a frame and key switch. The key switch includes a key sheet arranged in the frame. A key top is movably arranged on the key sheet. A movement amount detector detects movement amount of the key top. The movement amount detector includes a magnet arranged on the key top. A magnetic detection sensor is arranged in or below the key sheet. An electric circuit is arranged below the key sheet to process a signal output from the magnetic detection sensor. The electric circuit is covered by the key sheet. The key sheet is formed from a material that is water resistant and transmits magnetism.

A further aspect of the present invention is an electronic device including a frame and a key switch. The key switch includes a key sheet arranged in the frame. A key top is movably arranged on the key sheet. A movement amount detector detects movement amount of the key top. The movement amount detector includes a reflective member arranged on the key top, a light source, and light detection sensor arranged in or below the key sheet. An electric circuit, arranged below the key sheet, processes a signal output from the light detection sensor. The electric circuit is covered by the key sheet, and the key sheet is formed from a material that is water resistant and transmits magnetism.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

[First Embodiment]

A jog dial switch 11 for a cellular phone according to a first embodiment of the present invention will now be discussed with reference to the drawings.

Figure 1A:
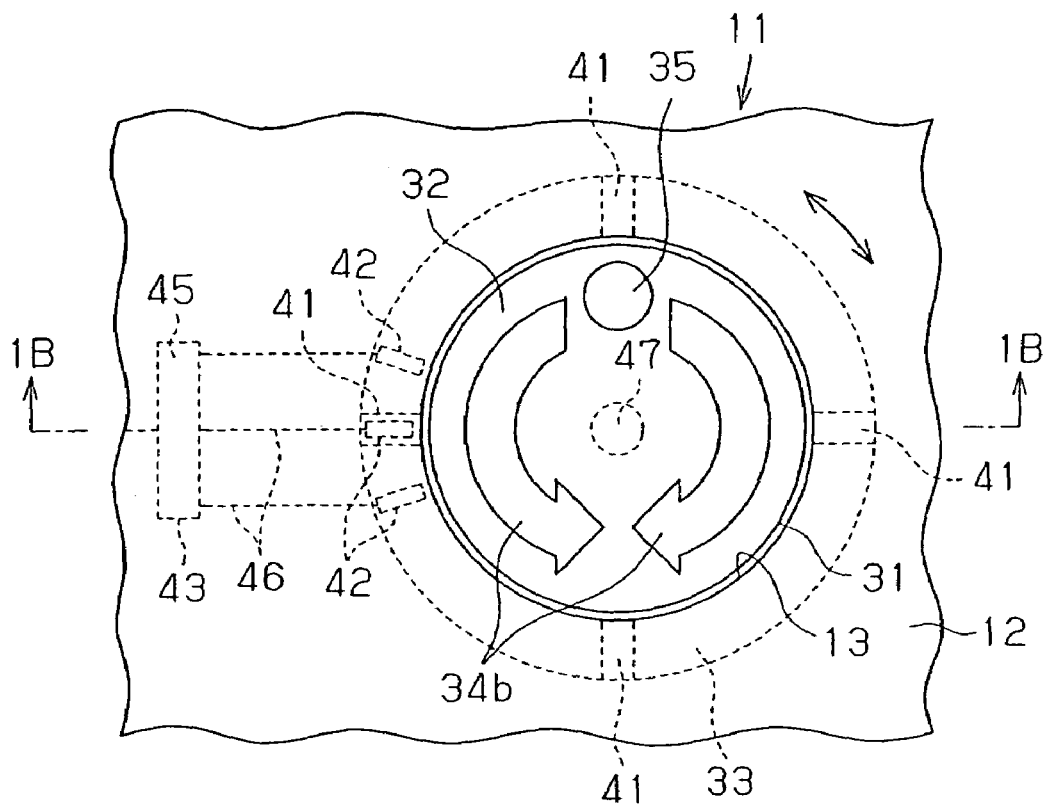
FIG. 1A is a plan view showing a jog dial switch according to a first embodiment of the present invention.
Figure 1B:
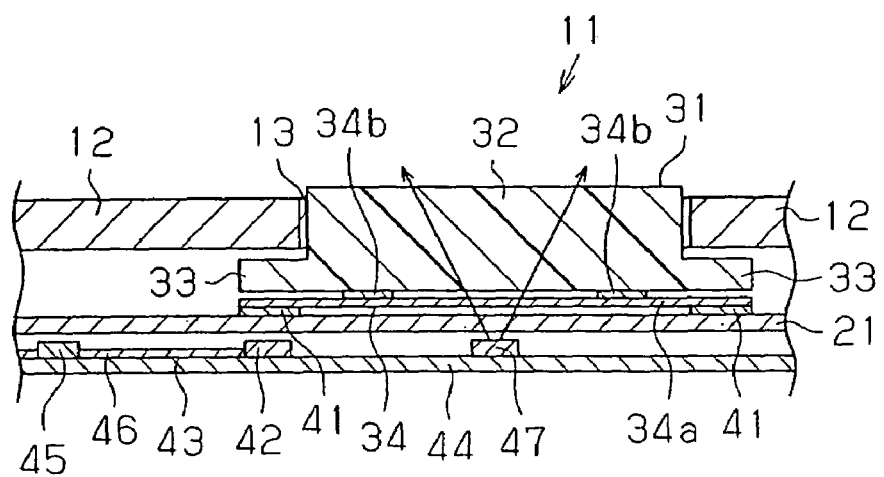
FIG. 1B is a cross-sectional view taken along line 1B—1B in FIG. 1A.

As shown in FIGS. 1A and 1B, the jog dial switch 11, which functions as a key switch, is arranged in a frame 12 of the cellular phone and used to perform an input operation of the cellular phone. The jog dial switch 11 includes a key sheet 21, a circular key top 31 arranged on the key sheet 21, and a movement amount detector.

The key sheet 21 is made of a material that is water resistant, enables the transmission of magnetism, and translucent. More specifically, the key sheet 21 is made of a transparent or semi-transparent synthetic resin film, such as a polyethylene terephthalate (PET) film, a sheet of a transparent or semi-transparent elastomer molded body, or a metal sheet such as an aluminum sheet. The transparency of the semi-transparent synthetic resin film and the elastomer molded body would be low compared to when they are transparent but are such that they enable partial transmission of the irradiated light. The thickness of the key sheet 21 when formed by a metal sheet is thin and is, for example, 100 μm so that the key sheet 21 exhibits not only water resistance but also enables the transmission of magnetism and light. The key sheet 21 is arranged in the frame 12.

The key top 31 includes a key top body 32, a flange 33, and an ornamental portion 34. The key top body 32 is cylindrical and made of a translucent synthetic resin material. Examples of transparent synthetic resin materials include transparent or semi-transparent synthetic resin material such as, polycarbonate and PET. The key top body 32 is arranged in a circular opening 13 formed in the frame 12 and rotatable about an axis on the key sheet 21. A round operation recess 35 in the surface of the key top body 32 near the rim.

The flange 33 is annular and extends around the lower periphery of the key top body 32. Thus, the flange 33 is located in the frame 12. The flange 33 may be formed integrally with or separately from the key top body 32. When formed separately from the key top body 32, the flange 33 may be made of a translucent synthetic resin or a non-translucent material. Non-translucent materials include synthetic rubber, such as silicon rubber, and metals, such as aluminum. In the first embodiment, the flange 33 is formed integrally with the key top body 32.

The ornamental portion 34 includes an ornamental body 34a and two symbols 34b. The ornamental body 34a is disk-shaped and arranged facing the back surface of the key top body 32 and the flange 33. The ornamental body 34a is made of a material enabling the transmission of magnetism and light. More specifically, the ornamental body 34a is made of a transparent or semi-transparent synthetic resin film, a sheet of a transparent or semi-transparent elastomer molded body, or a metal sheet. When made of a metal sheet, the thickness of the ornamental body 34a is, for example, 100 μm.

The two symbols 34b are arrows indicating the rotation direction of the key top body 32 and marked on the surface of the ornamental body 34a. The surface of each symbol 34b is adhered to the back surface of the key top body 32. The surface of each symbol 34b has a dark color, such as black or navy blue.

The movement amount detector includes four permanent magnets 41, three Hall elements 42 functioning as a magnetic detection sensor, and an electric circuit 43 for processing signal output from Hall elements 42. Each permanent magnet 41 has the shape of a rectangular plate and is arranged on the back side of the flange 33 with the ornamental body 34a located in between. More specifically, each permanent magnet 41 is attached to the back surface of the ornamental body 34a. Further, the permanent magnets 41 are arranged at equal intervals facing the back surface of the flange 33. Some of the magnetic lines of force emitted from each permanent magnet 41 is transmitted through the key sheet 21 and under the key sheet 21.

Each Hall element 42 is arranged on the surface of a circuit board 44 arranged below the key sheet 21. The Hall elements 42 are arranged at equal intervals facing the back surface of the flange 33. The circuit board 44 is made of an electrically insulative material. More specifically, the circuit board 44 is made of a synthetic resin film, such as a PET film or a sheet of an elastomer molded body.

The electric circuit 43 is laid out on the surface of the circuit board 44. The electric circuit 43 includes a signal processor 45, such as a CPU, for processing signals output from the Hall elements 42, and wires 46 for connecting the Hall elements 42 to the signal processor 45. The key sheet 21 covers the electric circuit 43. Further, the peripheral portion of the key sheet 21 is fixed to the frame 12 so as to seal the frame 12. In addition to the Hall element 42 and the electric circuit 43, a light emitting element 47, such as a light emitting diode (LED), is also arranged on the surface of the circuit board 44. The light emitting element 47 emits light in an upward direction (toward the frame 12).

The operation of the jog dial switch 11 will now be described. When performing a predetermined input operation with the cellular phone, one places his or her fingertip in the operation recess 35 of the key top body 32 and rotates the key top body 32 for a predetermined amount. The rotation of the key top body 32 also rotates the flange 33. The rotation of the flange 33 moves the permanent magnets 41 toward or away from the Hall elements 42. The magnetic lines of force are constantly emitted from the permanent magnets 41. Thus, each Hall element 42 detects a change in the magnetic field as a permanent magnet 41 emitting magnetic lines of force moves towards or away from the Hall element 42, and outputs a signal to the signal processor 45 via the wire 46. The rotation amount (movement amount) of the key top 31 is determined from the signal.

When the input operation is performed in the dark, the light emitting element 47 emits light. The light emitted from the light emitting element 47 is directed upward as shown by the arrows in FIG. 1B. After being transmitted through the key sheet 21 and the ornamental body 34a, the light is transmitted through the key top body 32 and emitted outward. Thus, the key top 31 is visual in the dark. Further, the key top body 32 transmits light. This improves the appearance and design of the jog dial switch 11 in comparison to when the key top body 32 is made of a material that is not translucent. In addition, each symbol 34b has, for example, a black color. Thus, the symbols 34b can easily be seen from outside the key top body 32, which transmits light.

The first embodiment has the advantages described below.

Each permanent magnet 41 of the first embodiment is arranged above the key sheet 21 and on the back surface of the flange 33 with the ornamental body 34a located in between. The circuit board 44 is arranged below the key sheet 21. The key sheet 21, which is formed from a water resistant material, covers the electric circuit 43, which is laid out on the circuit board 44. Further, the peripheral portion of the key sheet 21 is fixed to the frame 12 so as to seal the frame 12. Thus, water or dust entering the frame 12 from between the opening 13 and the key top body 32 does not approach the electric circuit 43 through the key sheet 21 or from around the key sheet 21. That is, water and dust is prevented from entering the frame 12 downward from the key sheet 21 and therefore does not come into contact with the electric circuit 43. Therefore, even if water or dust enters the frame 12, the Hall elements 42 would still detect changes in the magnetic field and output signals. Further, the permanent magnets 41 constantly emit the magnetic lines of force even when coming into contact with water or dust that has entered the frame 12. Consequently, in the jog dial switch 11, the movement amount detector has improved water resistance and dust resistance.

In the prior art structure in which the electric circuit 43 is arranged on the key sheet 21, a resist film may be formed on the surface of the key sheet 21 to protect the electric circuit 43 from the water and dust that has entered the frame 12. However, since such a resist film must be formed after the electric circuit 43 is formed on the surface of the key sheet 21, the manufacturing of the jog dial switch 11 becomes complicated. In the first embodiment, the key sheet 21 functions to support the key top 31 and protect the electric circuit 43. Thus, there is no need to form a resist film on the circuit board 44, and the manufacturing of the jog dial switch 11 is simplified.

The key top 31 of the first embodiment is made of a translucent synthetic resin material. Further, the flange 33 is located in the frame 12 and cannot be seen from outside the frame 12. The permanent magnet 41 is arranged on the back surface of the flange. Thus, only the symbols 34b, which improve the design of the jog dial switch 11, can be seen through the key top body 32. The permanent magnet 41, which deteriorates the design of the jog dial switch 11, cannot be seen through the key top body 32. This improves the design of the jog dial switch 11.

The surface of each symbol 34b in the first embodiment is adhered to the back surface of the key top body 32. This prevents damage to each symbol 34b that would be caused by wear and the like resulting from input operations when the symbols 34b are arranged on the surface of the key top body 32. Further, the symbols 34b can be easily seen from the outer side. This also improves the design of the jog dial switch 11.

[Second Embodiment]

A jog dial switch 11 according to a second embodiment of the present invention will now be discussed with reference to the drawings. Parts differing from the first embodiment will be described.

Figure 2A:
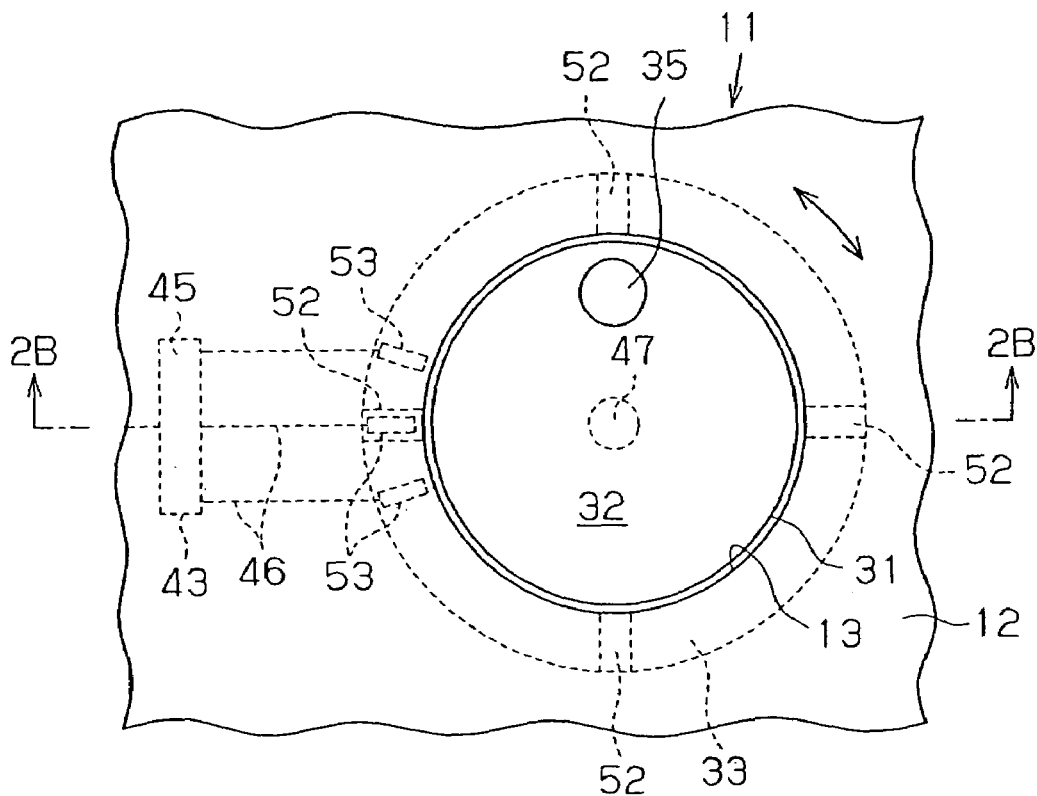
FIG. 2A is a plan view showing a jog dial switch according to a second embodiment of the present invention.
Figure 2B:
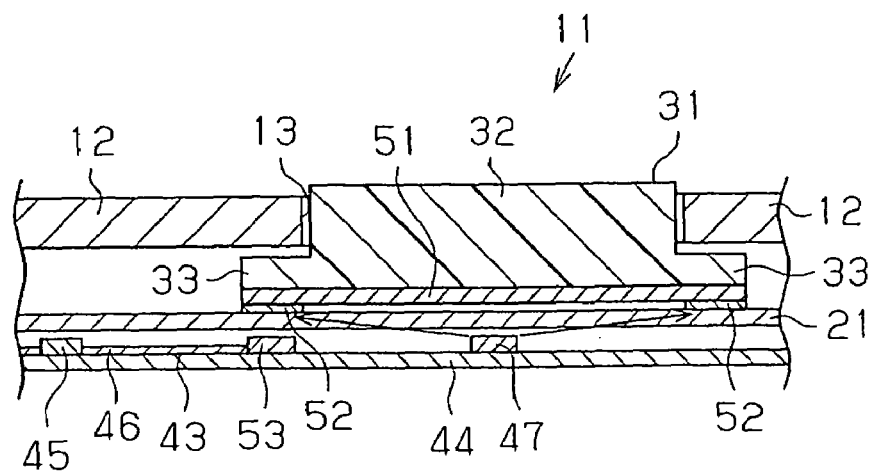
FIG. 2B is a cross-sectional view taken along line 2B—2B in FIG. 2A.

As shown in FIGS. 2A and 2B, a key top 31 includes a key top body 32 and a flange 33. A movement amount detector includes a reflective layer 51 functioning as a reflective member, four light absorption layers 52 functioning as light absorption members, three light receiving elements 53 functioning as light detection sensors, a light emitting element 47 functioning as a light source, and an electric circuit 43.

The reflective layer 51 is applied to the entire back surface of the key top body 32 and the flange 33. The reflective layer 51 is made of a synthetic resin material, such as a PET, or a metal material, such as aluminum or chromium. The surface of the reflective layer 51, when made of a synthetic resin material, has a bright color such as, white or yellow. The thickness of the reflective layer 51, when made of metal material, is preferably greater than or equal to 5 nm and is, for example, 20 nm or 40 nm. If the thickness of the reflective layer 51 made of metal material is less than 5 nm, the light reflectivity of the reflective layer 51 becomes less than 60%. Therefore, most of the light emitted from the light emitting element 47 would be transmitted through the reflective layer 51, and it would become difficult for the reflective layer 51 to reflect light. The light reflectivity of the reflective layer 51, when made of aluminum and having a thickness of 20 nm, is between 85% and 90%. The light reflectivity of the reflective layer 51, when made of aluminum and having a thickness of 40 nm, is 95%. The surface of the reflective layer 51 is an ornamental surface that improves the design of the jog dial switch 11.

Each light absorption layer 52 is generally rectangular and arranged on the back surface of the flange 33 with the reflective layer 51 located in between. More specifically, each light absorption layer 52 is arranged on the back surface of the reflective layer 51. Further, each light absorption layer 52 is arranged at equal intervals facing the back surface of the flange 33. Each light absorption layer 52 is made of a material that absorbs light. Such a light absorbing material includes synthetic rubber.

Each light receiving element 53 is arranged under the key sheet 21 on the surface of the circuit board 44. The light receiving elements 53 are arranged at equal intervals facing the back surface of the flange 33. The electric circuit 43 includes a signal processor 45 for processing signals output from the light receiving elements 53 and wires 46 for connecting the light receiving elements 53 to the signal processor 45.

The operation of the jog dial switch 11 will now be described. When a predetermined input operation is performed with the cellular phone, the light emitting element 47 emits light. The light emitted from the light emitting element 47 and transmitted through the key sheet 21 is mostly reflected downward by the reflective layer 51, but partially irradiated on the key top body 32. When the reflective layer 51 directly faces a light receiving element 53, some of the light reflected by the reflective layer 51 enters the light receiving element 53. Further, as shown by the arrows in FIG. 2B, when the reflective layer 51 faces toward a light receiving element 53 with a light absorption layer 52 located in between, that is, when the light receiving element 53 faces toward the light absorption layer 52, the light absorption layer 52 absorbs light and reduces the incident light of the light receiving element 53.

Next, one places his or her fingertip in an operation recess 35 of the key top body 32 and rotates the key top body 32 for a predetermined amount. The rotation of the key top body 32 also rotates the flange 33. Thus, each light receiving element 53 directly faces the reflective layer 51 and the light absorption layer 52 in an alternating manner. The rotation of the flange 33 changes the amount of light entering each light receiving element 53. The light receiving element 53 detects the change in the light amount and outputs the signal to the signal processor 45 through the wire 46. The amount of movement of the key top 31 is then determined from the signal. The light irradiating the key top body 32 is transmitted through the key top body 32 and emitted outward. Therefore, the key top 31 can easily be seen in the dark.

The second embodiment has the advantages described below.

In the second embodiment, the light absorption layer 52 is arranged above the key sheet 21 on the back surface of the flange 33 with the reflective layer 51 located in between. The circuit board 44 is arranged below the key sheet 21. Thus, even if water or dust enters the frame 12, the light emitting element 47 emits light, and each light receiving element 53 detects changes in the amount of light and outputs the signal. Further, the reflective layer 51 reflects light and the light absorption layers 52 absorbs light even when coming into contact with water or dust that has entered the frame 12. Thus, the jog dial switch 11 has improved water resistance and dust resistance.

The key top 31 of the second embodiment is made of a translucent synthetic resin material. The surface of the reflective layer 51 is an ornamental surface. Each light absorption layer 52 is arranged on the back surface of the flange 33, and the flange 33 cannot be seen from the outer side of the frame 12. Thus, only the ornamental surface can be seen through the key top body 32, and the light absorption layers 52, which deteriorate the design of the jog dial switch 11, are hidden. This improves the design of the jog dial switch 11.

In the second embodiment, the reflective layer 51 is arranged on the back surface of the key top body 32 and the flange 33. This prevents damage to the reflective layer 51 that would be caused by wear and the like resulting from input operations when the reflective layer 51 is arranged on the surface of the key top body 32 and the flange 33.

It should be apparent to those skilled in the art that the present invention may be embodied in many other specific forms without departing from the spirit or scope of the invention. Particularly, it should be understood that the present invention may be embodied in the following forms.

In the first embodiment, if lighting of the key top body 32 with a backlight is unnecessary, the key sheet 21 may be made of a material that is non-translucent but is water resistant and enables the transmission of magnetism. In such a case, the light emitting element 47 is eliminated.

In the first embodiment, the surface of the ornamental body 34a may be an ornamental surface that improves the design of the jog dial switch 11. The arrangement of the ornamental surface under the key top 31 would prevent damage to the ornamental surface that would be caused by wear and the like resulting from input operations.

In the first embodiment, instead of the permanent magnets 41 being arranged on the back surface of the flange 33, the permanent magnets 41 may be arranged on the back surface of the key top body 32 with the ornamental body 34a located in between. In this case, the permanent magnets 41 are shaped so as to improve the design of the jog dial switch 11. This improves the design of the jog dial switch 11 since the permanent magnets 41 can be seen from the outer side of the ornamental body 34a. Further, the ornamental body 34a may be made of a material that is non-translucent to reduce the visibility of the permanent magnet 41 from the outer side of the jog dial switch 11.

In the first embodiment, the ornamental portion 34 may be eliminated. In this case, each permanent magnet 41 may be attached to the back surface of the flange 33 or be embedded in the flange 33. Further, an ornamental layer that improves the design of the jog dial switch 11 may be arranged on the back surface of the key top body 32. The ornamental layer may be printed with ink on the back surface of the key top body 32 be formed by depositing metal material on the back surface of the key top body 32. The thickness of a printed ornamental layer is, for example, greater than or equal to 1 μm and less than 40 μm. The thickness of an ornamental layer formed by depositing metal material is, for example, between 10 and 80 nm.

In the first embodiment, the ornamental portion 34 may be arranged inside the key top body 32 and the flange 33.

In the first embodiment, the number of the permanent magnets 41 and the Hall elements 42 may be changed as required. In the second embodiment, the number of the light absorption layers 52 and the light receiving elements 53 may be changed as required.

In the first embodiment, the Hall element 42 may be adhered to the back surface of the key sheet 21 or be embedded in the key sheet 21. Similarly, in the second embodiment, the light receiving elements 53 may be adhered to the back surface of the key sheet 21 or be embedded in the key sheet 21.

In the first embodiment, a low-friction layer may be formed on the back surface of the permanent magnet 41. Similarly, in the second embodiment, a low-friction layer may be formed on the back surface of the light absorption layer 52. The low-friction layer is made of a synthetic material of silicon or paraffin. The surface of the low-friction layer has a low coefficient of friction and thus enables sliding of the key top 31. This facilitates the rotation of the key top 31.

In the second embodiment, the flange 33 may be eliminated. In this case, the light absorption layers 52 are arranged on the back surface of the key top body 32 with the reflective layer 51 located in between, and each light receiving element 53 is arranged so as to face the light absorption layers 52. Further, in order to prevent the key top 31 from falling out of the frame 12, the key top body 32 may be conical.

Figure 3A:
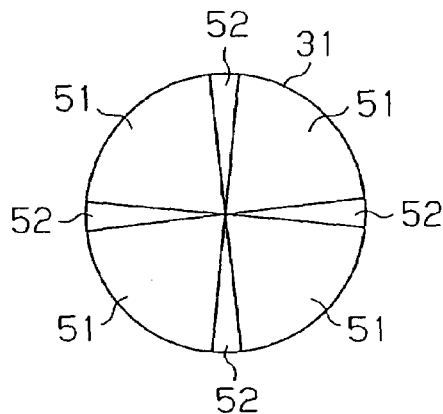
FIG. 3A is a rear view showing a light absorption layer according to a further embodiment of the present invention.

In the second embodiment, the light absorption layer 52 may extend not only along the back surface of the flange 33 but also along the back surface of the key top body 32. Further, the light absorption layers 52 may be shaped to improve the design of the jog dial switch 11. For example, as shown in FIG. 3A, the light absorption layers 52 may be triangular and have a vertex positioned at the center of the key top body 32. In this case, the reflective layers 51 are shaped to reflect most of the irradiated light and transmit part of the light. In this structure, the light absorption layers 52 can be seen from the outer side though the reflective layer 51. This improves the design of the jog dial switch 11.

In the second embodiment, the reflective layer 51 may be arranged inside the key top body 32 and the flange 33.

Figure 4A:
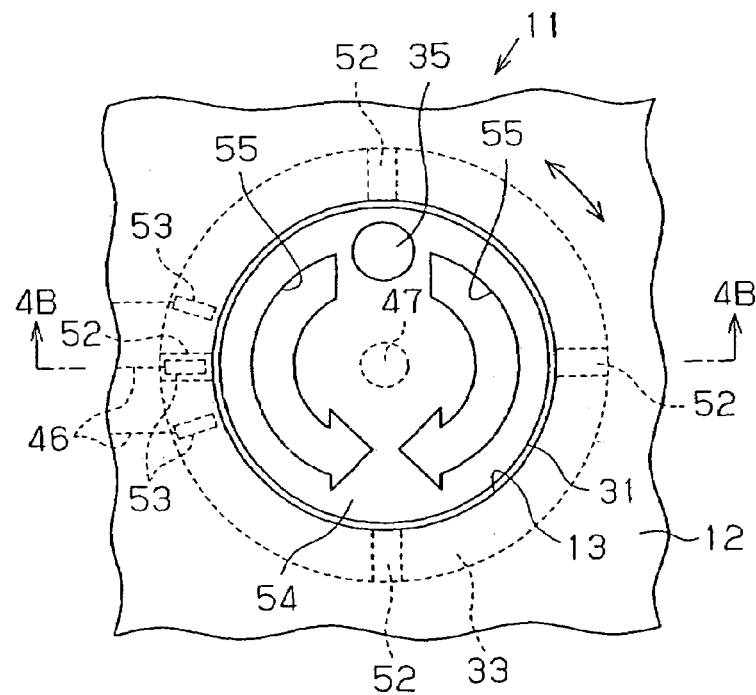
FIG. 4A is a plan view showing a jog dial switch according to still another embodiment of the present invention.
Figure 4B:
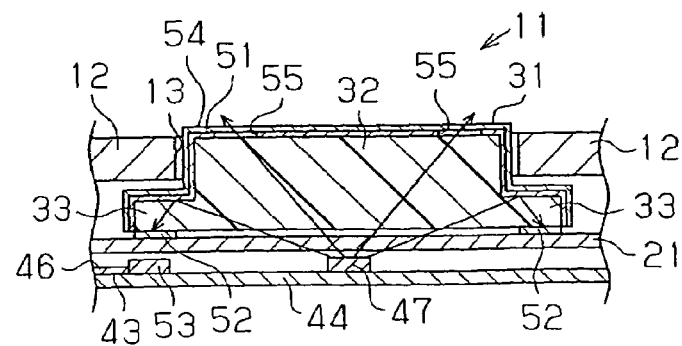
FIG. 4B is a cross-sectional view taken along line 4B—4B in FIG. 4A.

Alternatively, the reflective layer 51 may be arranged on the surface of the key top body 32 and the flange 33. When the reflective layer 51 is arranged on the surface of the key top body 32 and the flange 33, as shown in FIGS. 4A and 4B, it is preferred that a protective layer 54 be applied to the surface of the reflective layer 51 to prevent the reflective layer 51 from being damaged by wear and the like resulting from input operations. The protective layer 54 is made of a translucent synthetic resin material. It is preferred that ornamental openings 55 be formed in the reflective layer 51 to improve the design of the jog dial switch 11. The ornamental opening 55 may be shaped as an arrow indicating the rotating direction of the key top body 32. Some of the light emitted from the light emitting element 47 is transmitted through the key sheet 21 and the key top body 32 and then emitted outward from the ornamental opening 55. This improves the design of the jog dial switch 11.

The light emitting element 47 in the first and second embodiments may be arranged on the back surface of the key sheet 21 or be arranged on other members arranged below the key sheet 21.

Figure 3B:
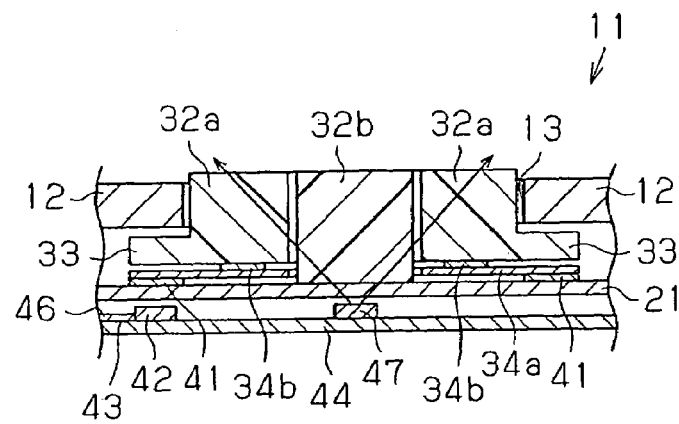
FIG. 3B is a cross-sectional view showing a key top body according to another embodiment of the present invention.

The key top body 32 in the first and second embodiments may include an input operation key top and a turn support key top. More specifically, as shown in FIG. 3B, a key top body may include an annular input operation key top 32a and a cylindrical turn support key top 32b, which is inserted in the input operation key top 32a. The bottom surface of the turn support key top 32b is attached to the surface of the key sheet 21. The input operation key top 32a is rotated on the key sheet 21 about the turn support key top 32b. The flange 33 extends along the lower periphery of the input operation key top 32a.

The jog dial switch 11 of the first and second embodiments may be used to perform input operations for electronic devices other than a cellular phone, such as a remote controller.

The jog dial switch 11 of the first and second embodiments may be a switch in which the key top 31 is movable in upward and downward directions. In this case, the layout of the permanent magnets 41 and the Hall elements 42 may be changed as required.

In the second embodiment, the light absorption layer 52 may be eliminated. In this case, the reflective layer 51 is applied to the only part of the key top body 32 and the flange 33.

The flange 33 in the first and the second embodiments may be polygonal. Further, the flange 33 may be arranged along only part of the peripheral portion of the key top body 32. In such a structure, when the periphery of the flange 33 contacts the frame 12, the friction created by the frame 12 is less compared to when the flange 33 is annular.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A key switch comprising:
   a key sheet arranged in a frame;
   a key top movably arranged on the key sheet; and
   a movement amount detector for detecting movement amount of the key top, the movement amount detector including:
   a magnet arranged on the key top;
   a magnetic detection sensor arranged in or below the key sheet; and
   an electric circuit, arranged below the key sheet, for processing a signal output from the magnetic detection sensor, the electric circuit being covered by the key sheet, and the key sheet being formed from a material that is water resistant and transmits magnetism.

2. The key switch according to claim 1, wherein the key top is made of a translucent synthetic resin material and includes a flange, the flange being located in the frame, and the magnet being arranged on the flange.

3. The key switch according to claim 2, further comprising:
   an ornamental portion arranged in or below the key top.

4. The key switch according to claim 2, further comprising a light source.

5. A key switch comprising:
   a key sheet arranged in a frame;
   a key top movably arranged on the key sheet; and
   a movement amount detector for detecting movement amount of the key top, the movement amount detector including:
   a reflective member arranged on the key top;
   a light source;
   a light detection sensor arranged in or below the key sheet; and
   an electric circuit, arranged below the key sheet, for processing a signal output from the light detection sensor, the electric circuit being covered by the key sheet, and the key sheet being formed from a material that is water resistant and translucent.

6. The key switch according to claim 5, further comprising:
   an ornamental surface, wherein the key top is made of a translucent synthetic resin material, the reflective member is arranged in or below the key top, and the ornamental surface is defined by the surface of the reflective member.

7. The key switch according to claim 5, wherein:
   the reflective member is arranged along the entire key top; and
   the movement amount detector further includes a light absorption member, the light absorption member being located below the reflective member.

8. The key switch according to claim 7, wherein the key top includes a flange, with the flange located in the frame, and the light absorption member being arranged on the flange.

9. The key switch according to claim 5, further comprising:
   a protective member arranged above the key top, wherein the key top is made of a translucent synthetic resin material, and the reflective member is arranged between the protective member and the key top.

10. An electronic device comprising:
    a frame; and
    a key switch, the key switch including:
    a key sheet arranged in the frame;
    a key top movably arranged on the key sheet; and
    a movement amount detector for detecting movement amount of the key top, the movement amount detector including:

a magnet arranged on the key top;

a magnetic detection sensor arranged in or below the key sheet; and an electric circuit, arranged below the key sheet, for processing a signal output from the magnetic detection sensor, the electric circuit being covered by the key sheet, and the key sheet being formed from a material that is water resistant and transmits magnetism.

11. The electronic device according to claim 10, wherein the key top is made of a translucent synthetic resin material and includes a flange, the flange being located in the frame, and the magnet being arranged on the flange.

12. The electronic device according to claim 11, wherein the key switch further includes an ornamental portion arranged below the key top.

13. The electronic device according to claim 11, wherein the key switch further includes a light source.

14. An electronic device comprising:

a frame; and a key switch, the key switch including:

a key sheet arranged in the frame;

a key top movably arranged on the key sheet; and a movement amount detector for detecting movement amount of the key top, the movement amount detector including:

a reflective member arranged on the key top;

a light source;

a light detection sensor arranged in or below the key sheet; and an electric circuit, arranged below the key sheet, for processing a signal output from the light detection sensor, the electric circuit being covered by the key sheet, and the key sheet being formed from a material that is water resistant and translucent.

15. The electronic device according to claim 14, wherein the key switch further includes an ornamental surface, the key top being made of a translucent synthetic resin material, the reflective member being arranged in or below the key top, and the ornamental surface being defined by the surface of the reflective member.

16. The electronic device according to claim 14, wherein:

the reflective member is arranged along the entire key top; and the movement amount detector further includes a light absorption member, the light absorption member being located below the reflective member.

17. The electronic device according to claim 16, wherein the key top includes a flange, the flange is located in the frame, and the light absorption member is arranged on the flange.

18. The electronic device according to claim 14, wherein the key switch further includes a protective member arranged above the key top, the key top being made of a translucent synthetic resin material, and the reflective member being arranged between the protective member and the key top.

* * * * *